(12) United States Patent
Kim et al.

(10) Patent No.: US 11,922,061 B2
(45) Date of Patent: Mar. 5, 2024

(54) ADAPTIVE MEMORY REFRESH CONTROL

(71) Applicant: Micron Technology, Inc., Boise, ID (US)

(72) Inventors: Kang-Yong Kim, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 17/458,068

(22) Filed: Aug. 26, 2021

(65) Prior Publication Data

US 2022/0066700 A1    Mar. 3, 2022

Related U.S. Application Data

(60) Provisional application No. 63/124,539, filed on Dec. 11, 2020, provisional application No. 63/072,671, filed on Aug. 31, 2020.

(51) Int. Cl.
*G06F 3/06* (2006.01)
*G11C 11/406* (2006.01)

(52) U.S. Cl.
CPC .......... *G06F 3/0659* (2013.01); *G06F 3/0619* (2013.01); *G11C 11/40615* (2013.01)

(58) Field of Classification Search
CPC .............. G11C 11/40615; G06F 3/0659; G06F 3/0619
See application file for complete search history.

(56) References Cited

U.S. PATENT DOCUMENTS

| | | |
|---|---|---|
| 8,045,365 B2 | 10/2011 | Oh |
| 9,001,608 B1 | 4/2015 | Chishti et al. |
| 11,195,568 B1 | 12/2021 | Atishay et al. |
| 11,783,883 B2 | 10/2023 | Kim et al. |

(Continued)

FOREIGN PATENT DOCUMENTS

| | | |
|---|---|---|
| WO | 2022047265 | 3/2022 |
| WO | 2022094267 | 5/2022 |

OTHER PUBLICATIONS

"International Preliminary Report on Patentability", Application No. PCT/US2021/048111, dated Feb. 28, 2023, 7 pages.

(Continued)

*Primary Examiner* — Eric Cardwell
(74) *Attorney, Agent, or Firm* — Colby Nipper PLLC

(57) ABSTRACT

Systems, apparatuses, and methods related to a memory device and an associated host device are described. The memory device and the host device can include control logic that allow the memory device and host device to share refresh-timing information, which may allow either the memory device or the host, or both, to manage operations during time that is dedicated to, but unused for, refresh or self-refresh operations. Refresh-timing information shared from the host device may indicate elapsed time since the host device issued a refresh command to the memory device and/or how much time remains before the host device is scheduled to issue another refresh command. Refresh-timing information shared from the memory device may indicate elapsed time since the memory device performed a self-refresh operation and/or how much time remains before the memory device is scheduled to initiate or undergo another self-refresh operation.

27 Claims, 8 Drawing Sheets

(56) References Cited

U.S. PATENT DOCUMENTS

| | | |
|---|---|---|
| 11,783,885 B2 | 10/2023 | Kim et al. |
| 2007/0277065 A1 | 11/2007 | Sato |
| 2008/0016272 A1* | 1/2008 | Harrand ............ G11C 11/40615 |
| | | 711/E12.08 |
| 2013/0279283 A1* | 10/2013 | Seo ........................ G11C 7/00 |
| | | 365/222 |
| 2014/0016423 A1* | 1/2014 | Ware ................ G11C 11/40622 |
| | | 365/222 |
| 2014/0043888 A1 | 2/2014 | Chen et al. |
| 2015/0378817 A1 | 12/2015 | Tsern et al. |
| 2016/0163377 A1 | 6/2016 | Oh et al. |
| 2017/0062038 A1* | 3/2017 | Doo ................ G11C 11/40603 |
| 2017/0069371 A1* | 3/2017 | Shin ................ G11C 11/40615 |
| 2017/0075603 A1 | 3/2017 | Trantham |
| 2017/0140810 A1 | 5/2017 | Choi et al. |
| 2017/0278562 A1 | 9/2017 | Nale |
| 2018/0047439 A1 | 2/2018 | Bains et al. |
| 2018/0096719 A1* | 4/2018 | Tomishima ............ G11C 29/48 |
| 2019/0130963 A1 | 5/2019 | Lee |
| 2019/0139597 A1 | 5/2019 | Nakaoka |
| 2019/0341099 A1 | 11/2019 | Kim |
| 2019/0371391 A1 | 12/2019 | Cha et al. |
| 2020/0201718 A1 | 6/2020 | Richter et al. |
| 2020/0258566 A1 | 8/2020 | Schaefer et al. |
| 2021/0335416 A1 | 10/2021 | Joo |
| 2022/0050748 A1 | 2/2022 | Kim et al. |
| 2022/0068365 A1 | 3/2022 | Kim et al. |
| 2022/0139448 A1 | 5/2022 | Kim et al. |

OTHER PUBLICATIONS

"International Preliminary Report on Patentability", Application No. PCT/US2021/047956, dated Feb. 28, 2023, 8 pages.

"Non-Final Office Action", U.S. Appl. No. 17/513,090, dated Jan. 3, 2023, 12 pages.

"Non-Final Office Action", U.S. Appl. No. 17/459,446, dated Apr. 3, 2023, 7 pages.

"International Search Report and Written Opinion", Application No. PCT/US2021/057341, dated Feb. 21, 2022, 10 pages.

"International Search Report and Written Opinion", Application No. PCT/US2021/048111, dated Dec. 15, 2021, 10 pages.

"International Search Report and Written Opinion", Application No. PCT/US2021/047956, dated Dec. 16, 2021, 12 pages.

"Restriction Requirement", U.S. Appl. No. 17/513,090, dated Sep. 28, 2022, 7 pages.

"Advisory Action", U.S. Appl. No. 17/513,090, ated Jun. 16, 2023, 3 pages.

"Final Office Action", U.S. Appl. No. 17/513,090, dated Apr. 5, 2023, 9 pages.

"International Preliminary Report on Patentability", Application No. PCT/US2021/057341, dated May 2, 2023, 7 pages.

"Notice of Allowance", U.S. Appl. No. 17/459,446, dated Jul. 17, 2023, 8 pages.

"Notice of Allowance", U.S. Appl. No. 17/513,090, dated Jul. 18, 2023, 16 pages.

* cited by examiner 400-1

| SDRAM Command | SDR CMD Pin | CA Bus 114 | | | | | | | CK_t Edge |
|---|---|---|---|---|---|---|---|---|---|
| | CS | CA0 | CA1 | CA2 | CA3 | CA4 | CA5 | CA6 | |
| SRE | H | L | L | L | H | L | H | H | R1 |
| | X | V | V | V | OP0 | OP1 | OP2 | PD | F1 |

400-2

| OP2 | OP1 | OP0 | Time Remaining from Interval 304 (microseconds) |
|---|---|---|---|
| L | L | L | 0 |
| L | L | H | 2 |
| L | H | L | 4 |
| L | H | H | 6 |
| H | L | L | 8 |
| H | L | H | 10 |
| H | H | L | 12 |
| H | H | H | 14 |

FIG. 4

ADAPTIVE MEMORY REFRESH CONTROL

CROSS-REFERENCE TO RELATED APPLICATION(S)

This application claims the benefit of U.S. Provisional Application No. 63/072,671, filed Aug. 31, 2020, and U.S. Provisional Application No. 63/124,539, filed Dec. 11, 2020, the disclosures of which are hereby incorporated by reference in their entireties herein.

BACKGROUND

Computers, smartphones, and other electronic devices operate using processors and memories. A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random-access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek smaller memories as the form factors of portable electronic device continue to shrink. Accommodating these various demands is complicated by the diverse strengths and capabilities of different types of memories.

BRIEF DESCRIPTION OF THE DRAWINGS

The details of one or more aspects of adaptive memory refresh control are described in this document with reference to the following drawings. The same numbers are used throughout the drawings to reference like features and components:

FIG. 3-1 illustrates an example operating diagram that depicts aspects of how adaptive memory refresh control can be implemented with a memory device or a host device;

FIG. 3-2 illustrates an example comparison diagram, which depicts aspects of how a memory device that does not implement adaptive memory refresh control operates relative to the operation of the memory device of FIG. 3-1;

FIG. 4 illustrates an example command truth table and an example look-up table that depict additional details of the example operating diagram of FIG. 3-1.

DETAILED DESCRIPTION

Overview

Figure 1:
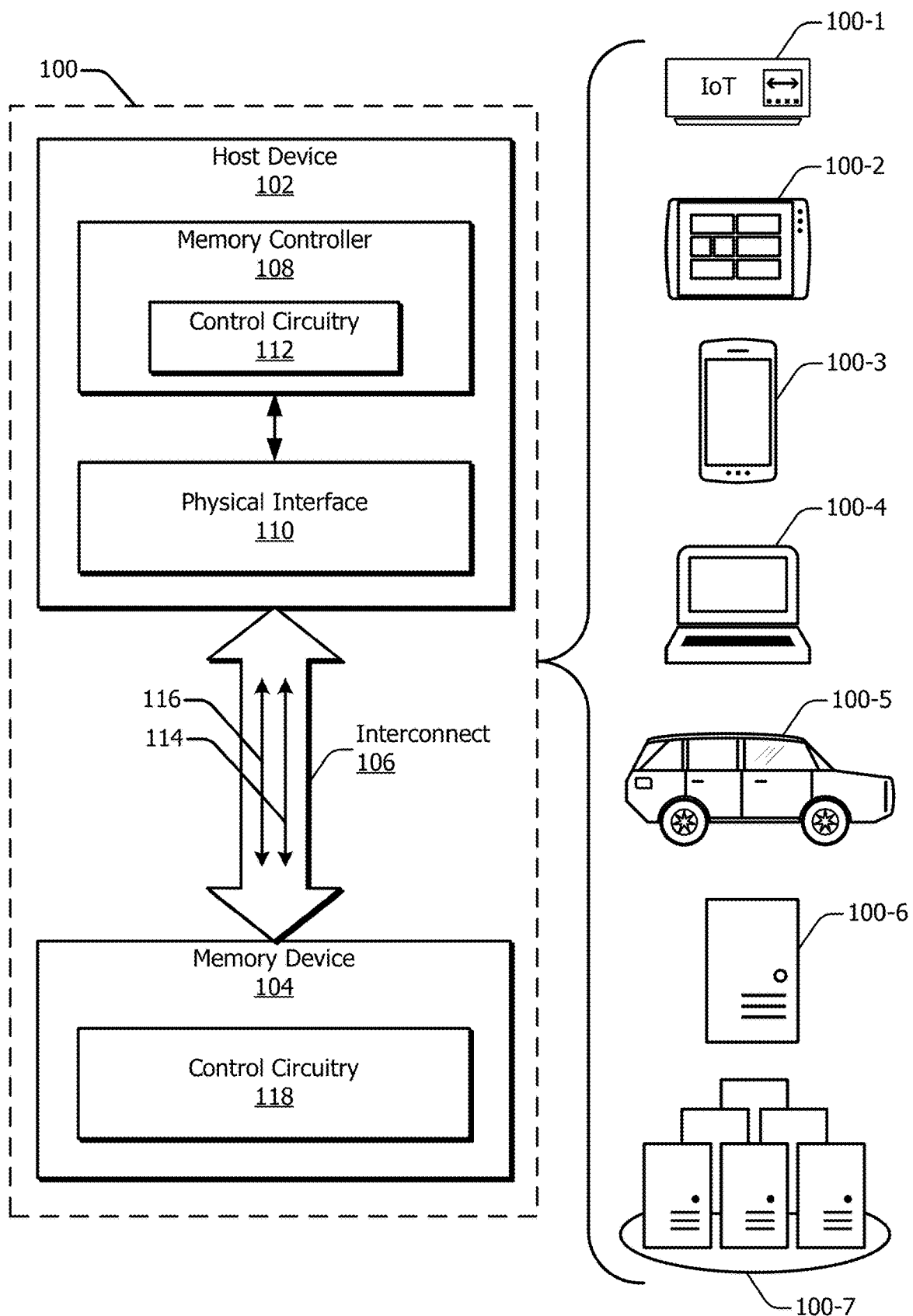
FIG. 1 illustrates an example apparatus that can implement aspects of adaptive memory refresh control.

For some applications, such as portable electronic devices that operate on battery power and data centers that employ thousands of memory devices, further reducing power usage for next-generation low-power memory can provide appreciable improvements in efficiency. These applications may also benefit from increasing memory performance by reducing memory-access latency or periods of memory unavailability. Some implementations that are described herein can provide one or both advantages for a memory device or system, including low-power memory types.

Double data rate synchronous dynamic random-access memory (DDR SDRAM), including low-power DDR (LPDDR) SDRAM, is a volatile memory, which means that the stored information is lost if power is not maintained. Because the memory cells of volatile memory are made in part from capacitors, the charge slowly drains from the memory cells and the data can be lost if the capacitor is not recharged. Therefore, to maintain an appropriate charge, the memory cells are periodically refreshed. To perform a refresh operation, the memory reads data from a memory cell corresponding to a refresh address into a temporary storage (e.g., a sense amp) and writes the data back to the memory cell with the proper charge. A refresh address can include memory cell addresses, rows addresses, bank addresses, and the like. Refresh operations may be initiated and controlled by a memory controller outside of the memory (e.g., using an auto-refresh command) or by operations performed internally (e.g., using a self-refresh operation).

Generally, each memory cell in a volatile memory is refreshed within a refresh interval referred to as tREF (e.g., approximately 32 milliseconds or approximately 64 milliseconds) to maintain the integrity of stored data. The memory controller may therefore issue a refresh command (e.g., an auto-refresh command) that corresponds to or includes one all-bank refresh (ABR) command or multiple per-bank refresh (PBR) commands, depending on the bank configuration (e.g., 4Bank/4BG mode, 8Bank mode, or 16Bank mode). The memory controller can issue the refresh command at a frequency sufficient to refresh each memory cell within the relevant interval. When the memory is in a power-saving mode (e.g., a self-refresh mode), the memory can perform the self-refresh operations at a similar rate or frequency.

The rate or frequency at which the refresh and self-refresh commands are issued can be based on triggers such as a time interval (e.g., a fraction of tREF) or on operations the memory controller or the memory device is performing. For example, an interval between refresh commands may be between approximately 3.9 microseconds (μs) and approximately 16 μs (e.g., approximately 4, approximately 8, or approximately 16 μs). The memory controller can include a refresh timer that is used to keep track of the refresh intervals for refresh commands. During the self-refresh periods, however, the memory controller and other host device components (e.g., communication or other interfaces) may be idle, so the memory device manages the refresh intervals for self-refresh operations using an internal self-refresh timer. Because a self-refresh operation may be missed if the memory controller issues a self-refresh exit command toward the end of a self-refresh interval, another independent refresh command may be issued by the memory controller between a self-refresh exit and a subsequent self-refresh entry.

In some memories, when the memory exits a self-refresh mode, the self-refresh timer value can be stored. When the memory next enters self-refresh, the self-refresh timer can read the saved value, increment the timer to the next value, and then perform self-refresh after the self-refresh timer expires, if the memory is in a self-refresh mode. Under some circumstances, this process can allow the memory to avoid a period of unavailability and/or additional power consumption by avoiding an unnecessary refresh operation upon entry and exit from self-refresh. While this feature can save the memory system from using some power, the memory controller does not have access to the memory's self-refresh timer, and the memory does not have access to the memory controller's refresh timer. Consequently, more refresh and/or self-refresh operations may still be performed than are actually "required" to maintain data integrity (e.g., performed under an operating architecture standard, such as LPDDR4 or LPDDR5, but not strictly necessary to maintain data integrity). In other words, "unnecessary" refresh operations may be performed because the memory device lacks information about the refresh timing at the host device or because the host device lacks information about the refresh timing at the memory device.

In contrast, consider the following discussion of techniques for taking advantage of the benefits of adaptive memory refresh control, which may be implemented as part of a volatile-memory architecture, including an LPDDR architecture, such as a post-LPDDR5 architecture. In the described techniques, the memory controller and the memory device share timer information (e.g., how much of a respective refresh interval has elapsed since the last refresh/self-refresh). For example, when transmitting a self-refresh entry (SRE) command, the memory controller can also provide refresh timer information to the memory device. The refresh timer information enables the memory device to wait until any remaining time (e.g., from the refresh interval being timed by the memory controller) expires before initiating, undergoing, or performing a self-refresh operation. Similarly, when the memory device receives a self-refresh exit (SRX) command, the memory device can output self-refresh timer information to the memory controller. In this way, the described adaptive memory refresh control techniques can improve power consumption. Further, such techniques may also improve system performance, including data rate and latency, by reducing the number of refresh operations that are performed, while maintaining memory reliability through timely refresh operations.

Consider an example implementation of the described techniques for adaptive memory refresh control in which an LPDDR memory includes self-refresh timer control circuitry that can access host-device refresh-timing information that is received as part of, or otherwise in association with, a command from a host device (e.g., an SRE command). The host-device refresh-timing information indicates when the host device is scheduled to perform a refresh operation (e.g., issue an auto-refresh command to the memory device). For example, the host-device refresh-timing information may include or otherwise indicate how much time has elapsed since the host device last issued a command to direct the memory device to perform a refresh operation or how much time remains before the host device is scheduled to issue a next command to direct the memory device to perform a refresh operation. The host-device refresh-timing information may, for example, be included with the SRE command by using available bits on a command bus that is part of an interconnect between the host device and the memory device. Based at least in part on the host-device refresh-timing information, the memory device can determine a self-refresh schedule for a memory cell of a memory array of the memory device. The described adaptive memory refresh control techniques may also be implemented for use with burst refresh commands and with operations in which refresh or self-refresh operations are postponed or pulled forward.

In response to another command, the memory device can transmit memory-device refresh-timing information to the host device. For example, in response to a self-refresh exit (SRX) command received from the host device, the memory device can output the memory-device refresh-timing information to the host device using, for example, an output data bus (e.g., one or more output DQ pins). In some implementations, the memory device outputs the memory-device refresh-timing information to the host device within a predefined time period of receiving the other command (e.g., within approximately 250 nanoseconds, within approximately 210 nanoseconds, within approximately 180 nanoseconds). Responsive to the memory-device refresh-timing information being transmitted via the output data bus, the host device enables an input buffer (e.g., the host DQ input buffer) during the predefined time period so that the memory-device refresh-timing information can be latched and stored for use by the host device. Sharing refresh-timer information between the host device and the memory device may lead to fewer refresh operations being performed, both in a normal operation or workflow (e.g., auto-refresh) mode and in a self-refresh mode. Reducing the number of refresh operations that are performed can enable not only reduced power consumption but may also lead to improved system performance (e.g., by reducing latency and increasing data rate) while maintaining memory reliability through timely and complete refresh operations.

Example Apparatuses and Systems

FIG. 1 illustrates an example apparatus 100 that can implement aspects of adaptive memory refresh control to save power, decrease latency, and improve reliability. The described implementations are applicable to memory generally, including those that may comport with an LPDDR memory specification, which may include post-LPDDR5 memory specifications (e.g., LPDDR6). Example implementations of the apparatus 100 include an internet-of-things (IoTs) device 100-1; a tablet device 100-2; a smartphone 100-3; a notebook computer 100-4; an automobile 100-5; a server computer 100-6; a server cluster 100-7 that may be part of cloud computing infrastructure or a data center; a portion thereof (e.g., a printed circuit board (PCB)); and/or the like. Other apparatus examples include a wearable device, such as a computing watch, smart-glasses or other eyewear; an entertainment device, such as a set-top box, a smart television, or an audio system; a vehicle or drone; a personal device such as a track pad, drawing pad, netbook, or e-reader; a home security system; a motherboard or server blade; industrial equipment; or a network-attached storage (NAS) device. Note that these electronic devices can be wearable, non-wearable but mobile, or relatively immobile (e.g., desktops or appliances).

In example implementations, the apparatus 100 includes a host device 102, a memory device 104 (e.g., a volatile memory device), and an interconnect 106. The host device 102 may be implemented with any of a variety of different integrated circuit chips, including a system-on-chip (SoC), an application-specific integrated circuit (ASIC), or an application-specific standard part (ASSP). As shown, the host device 102 includes a memory controller 108 and a physical interface (PHY) 110. The host device 102 may include other components that are not shown in FIG. 1. For example, the host device 102 may include one or more processors (e.g., a CPU, a GPU, or other core processor), one or more memories (e.g., a cache memory or a buffer memory), or one or more communication systems (e.g., interconnects, memory channels, or input/output (I/O) hardware or firmware).

The host device 102 may also include control circuitry 112. Although shown in FIG. 1 as included with the memory controller 108, the control circuitry 112 may be separate from the memory controller 108 and may be distributed across multiple other devices or dies. The control circuitry 112 can access memory-device refresh-timing information that is received from the memory device 104 (e.g., that is received in response to the host device issuing a command to the memory device). The memory-device refresh-timing information indicates when the memory device 104 is scheduled to perform, initiate, or undergo a refresh operation (e.g., a self-refresh or other refresh operation). For example, the memory-device refresh-timing information may include how much time has elapsed since the memory device 104 was refreshed or how much time remains before the memory device 104 is scheduled to perform, initiate, or undergo a refresh operation (e.g., a next self-refresh operation).

Based at least in part on the memory-device refresh-timing information, the host device 102 can determine a refresh-command schedule for the memory device 104 (e.g., a schedule for sending auto-refresh commands that takes into account the memory-device refresh-timing information when determining a timing for issuing a next auto-refresh command). Further, the host device 102 can determine host-device refresh-timing information based at least in part on the refresh-command schedule. The host-device refresh-timing information can include how much time has elapsed since the host device 102 last issued a refresh command or how much time remains before the host device 102 is scheduled to issue another refresh command (or both). The host device 102 can then transmit the host-device refresh-timing information to the memory device 104 (e.g., in association with another command for the memory device 104 to enter a self-refresh mode, such as an SRE command).

The memory controller 108 may be realized with any of a variety of suitable memory controllers (e.g., a DDR memory controller that can process requests for data stored on the memory device 104). The physical interface 110 may be realized as any of a variety of suitable physical interfaces that can transfer data between the memory controller 108 and the memory device 104 using the interconnect 106. For example, the physical interface 110 may be an interface that is compatible with a DDR PHY Interface (DFI) Group interface protocol. The memory controller 108 and the physical interface 110 may be coupled, directly or indirectly, to each other. The memory controller 108 and the physical interface 110 may also be coupled, directly or indirectly, to one or more other components included in the host device 102.

The interconnect 106 may be implemented with any of a variety of interconnects that communicatively couple together various components and enable data to be transferred between or among the various components. The interconnect 106 may include a bus, a switching fabric, one or more wires or traces that carry voltage or current signals, and so forth. In the example apparatus 100, the interconnect 106 may be separated into at least a command-and-address (CA) bus 114 and a data (DQ) bus 116 (e.g., for CA and DQ pins, respectively, on the memory device 104). In some implementations, the interconnect 106 may also include a chip-select (CS) I/O (not shown) that can be coupled to, for example, one or more CS pins on the memory device 104. In some implementations, the interconnect 106 may be realized as a combination of any two or more of the examples described herein.

Further, the electrical paths or couplings realizing the interconnect 106 can be shared between two or more memory components (e.g., dies, banks, bank groups, and so forth). In some implementations, the CA bus 114 is used only for transmitting addresses and commands from the memory controller 108 to the memory device 104. In other implementations, the CA bus 114 may be bidirectional and/or may propagate at least other control information. The DQ bus 116 can transmit data between the memory controller 108 and the memory device 104 bidirectionally. The memory device 104 may be realized with any suitable memory and/or storage facility including, but not limited to: Dynamic Random-Access Memory (DRAM), Synchronous DRAM (SDRAM), three-dimensional (3D) stacked DRAM, Double Data Rate (DDR) memory, or Low-Power DDR (LPDDR) memory. The memory device 104 may be configured with multiple memory cards or sticks, multiple memory dies, multiple memory arrays, multiple memory banks, combinations thereof, and so forth.

The memory device 104 may include or be in electronic communication with control circuitry 118 that can receive, read, or otherwise access host-device refresh-timing information. The host-device refresh-timing information may be received from the host device 102, such as by being associated with a command (e.g., a command directing the memory device 104 to enter a self-refresh mode, such as an SRE command). The host-device refresh-timing information indicates when then host device 102 is scheduled to perform, order, initiate, or undergo a refresh operation (e.g., issue an auto-refresh or other refresh command). For example, the host-device refresh-timing information may include how much time has elapsed since the host device 102 issued a command for the memory device 104 to initiate or undergo a refresh operation or how much time remains before the host device 102 is scheduled to issue another command for the memory device 104 to initiate or undergo a refresh operation. The host-device refresh-timing information may be included, for instance, with the SRE command via the CA bus 114 using one or more bits. These one or more bits may be unused or available in a definition of an SRE command under a current memory standard, such as LPDDR5. Alternatively, such one or more bits may part of a new memory-refresh-related command, may be transmitted over the interconnect 106 separately from a memory refresh command, and so forth. Based at least in part on the host-device refresh-timing information, the control circuitry 118 can determine a self-refresh schedule for refreshing the memory cells of the memory device 104. For example, the memory device 104 can enter the self-refresh mode in response to receiving the SRE command and initiate or undergo a self-refresh operation in the self-refresh mode after the amount of time that remains before the host device 102 was scheduled to issue a next refresh command (e.g., auto-refresh) to the memory device 104.

In some implementations, the control circuitry 118 can determine memory-device refresh-timing information based at least in part on the self-refresh schedule. The control circuitry 118 can also transmit the memory-device refresh-timing information to the host device 102 in response to another command (e.g., a command directing the memory device 104 to exit the self-refresh mode, such as an SRX command). The memory-device refresh-timing information indicates when the memory device 104 is scheduled to perform, initiate, or undergo a next self-refresh operation. For example, the memory-device refresh-timing information may include how much time has elapsed since the memory device 104 performed (e.g., started or completed) a self-refresh operation or how much time remains before the memory device 104 is scheduled to perform, initiate, or undergo a next self-refresh operation. The memory-device refresh-timing information may be transmitted to the host device 102 using, for example, the DQ bus 116 (e.g., one or more output DQ pins of the DQ bus 116).

Figure 2:
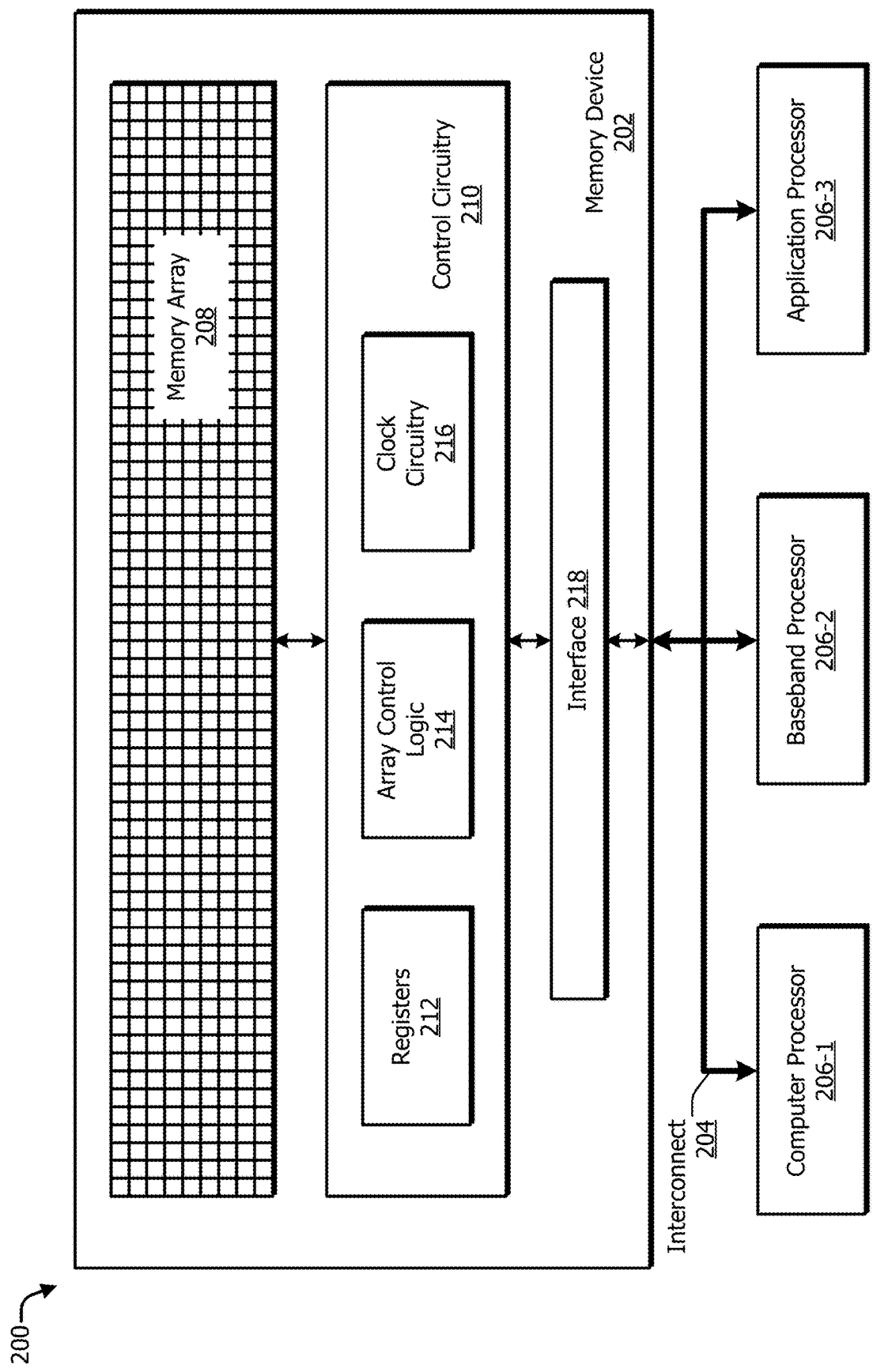
FIG. 2 illustrates an example computing system that can implement aspects of adaptive memory refresh control.

FIG. 2 illustrates an example computing system 200 that can implement aspects of adaptive memory refresh control. In some implementations, the computing system 200 includes at least one memory device 202, at least one interconnect 204, and at least one processor 206. The memory device 202 can include, or be associated with, at least one memory array 208, at least one interface 218, and control circuitry 210 that is communicatively coupled to the memory array 208. The memory device 202 can correspond to the memory device 104 of FIG. 1, and the control circuitry 210 can correspond to the control circuitry 118 of FIG. 1. Thus, the memory array 208 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, or Low-Power DDR (LPDDR) SDRAM. The memory array 208 and the control circuitry 210 may be components on a single semiconductor die or on separate semiconductor dies. The memory array 208 or the control circuitry 210 may also be distributed across multiple dies.

The control circuitry 210 can include any of a number of components that can be used by the memory device 202 to perform various operations (e.g., communicate with other devices, manage performance, and perform memory read or write operations). For example, the control circuitry 210 can include one or more registers 212, at least one instance of array control logic 214, and clock circuitry 216. The registers 212 may be implemented, for example, as one or more registers that can store information to be used by the control circuitry 210 or another part of the memory device 202. The array control logic 214 may be implemented as circuitry that can provide command decoding, address decoding, input/output functions, amplification circuitry, power supply management, power control modes, and other functions. The clock circuitry 216 may be implemented as circuitry that can provide synchronization of various components of the memory device 202 with one or more external clock signals that may be provided over the interconnect 204, such as a command/address clock (e.g., CK_t or CK_c) or a data clock (e.g., WCK_t or WCK_c), and/or with at least one clock signal that is generated internally.

The interface 218 can couple the control circuitry 210 or the memory array 208 directly or indirectly to the interconnect 204. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be implemented as separate components, which can be provided on a single semiconductor die or disposed across multiple semiconductor dies. These components of the control circuitry 210 may be individually or jointly coupled to the interconnect 204 via the interface 218.

The interconnect 204 may be implemented with any one or more of a variety of interconnects that communicatively couple together various components and enable commands, addresses, and/or other information and data to be transferred between two or more of the various components (e.g., between the memory device 202 and the one or more processors 206). For example, the interconnect 204 may be realized as the interconnect 106 described with reference to FIG. 1 or may be implemented in a manner similar to the interconnect 106. Although the interconnect 204 is represented with a single arrow in FIG. 2, the interconnect 204 may include a bus, a switching fabric, one or more wires or traces that carry voltage or current signals, at least one switch, one or more buffers, and so forth. Further, the interconnect 204 may be separated into at least a command-and-address (CA) bus and a data bus (as depicted in FIG. 1).

In some aspects, the memory device 202 may be realized as a "separate" physical component relative to the host device 102 of FIG. 1 or any of the processors 206. Examples of physical components, which may be separate, include: a printed circuit board (PCB), which can be rigid or flexible; a memory card; a memory stick; a memory module, including a single in-line memory module (SIMM) or a dual in-line memory module (DIMM); and so forth. Alternatively, the memory device 202 may be packaged or integrated with other physical components, including the host device 102 or a processor 206, such as by being combined on a common PCB or together in a single device package.

The apparatuses and methods that are described herein may be appropriate for memory that is designed for lower-power operations or that is targeted for energy-efficient applications. Thus, the described principles may be incorporated into a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

As shown in FIG. 2, the one or more processors 206 may include a computer processor 206-1, a baseband processor 206-2, and an application processor 206-3, which are coupled to the memory device 202 through the interconnect 204. The processors 206 may each be a CPU, a GPU, an SoC, an ASIC, an FPGA, or the like. In some cases, a single processor comprises multiple processing resources, each dedicated to different functions, such as modem management, applications, graphics, central processing, or the like. In some implementations, the baseband processor 206-2 may include or be coupled to a modem (not shown in FIG. 2) and may be referred to as a modem processor. The modem and/or the baseband processor 206-2 may be coupled wirelessly to a network via, for example, cellular, Wi-Fi®, Bluetooth®, near field, or another technology or protocol for wireless communication.

In some implementations, the processors 206 may be connected directly to the memory device 202 (e.g., via the interconnect 204). In other implementations, one or more of the processors may be indirectly connected to the memory device 202 (e.g., over a network connection, over multiple interconnects, or through one or more other devices). Further, a respective processor 206 can include or be associated with a respective memory controller, like the memory controller 108 depicted in FIG. 1. Alternatively, two or more processors 206 may access the memory device 202 using a shared or system memory controller 108.

In some implementations, the control circuitry 210 may also provide additional memory features, such as services similar to or the same as those provided by the control circuitry 118 as described with reference to FIG. 1. For example, the control circuitry 210 may read or access host-device refresh-timing information in association with a first command received from another device (e.g., from the host device 102 or the one or more processors 206), determine memory-device refresh-timing information, and transmit the memory-device refresh-timing information to the host device 102 in response to a second command. In some implementations, these features may be enabled in response to another command received from the processors 206 over the interconnect 204, including commands that direct the memory device 202 to enter or exit a self-refresh mode. In other implementations, these features can be enabled in response to an externally applied signal voltage, clock signal, or other signal or in response to the memory device 202 detecting a change in an operating mode (e.g., a beginning or ending of an operating mode, such as a self-refresh mode), a register setting, or an environmental condition.

These techniques, including the sharing of refresh-timer information (e.g., the host-device refresh-timing information and the memory-device refresh-timing information) between the host device and the memory device, may lead to fewer refresh operations being performed both in a normal operation or workflow mode (e.g., an auto-refresh mode) and in a self-refresh mode. Reducing the number of refresh operations that are performed can reduce power consumption and may improve system performance (e.g., by reducing latency and increasing data rate) while maintaining memory reliability through timely and complete refresh operations.

Example Methods and Operational Schemes

Figures 1, 3:
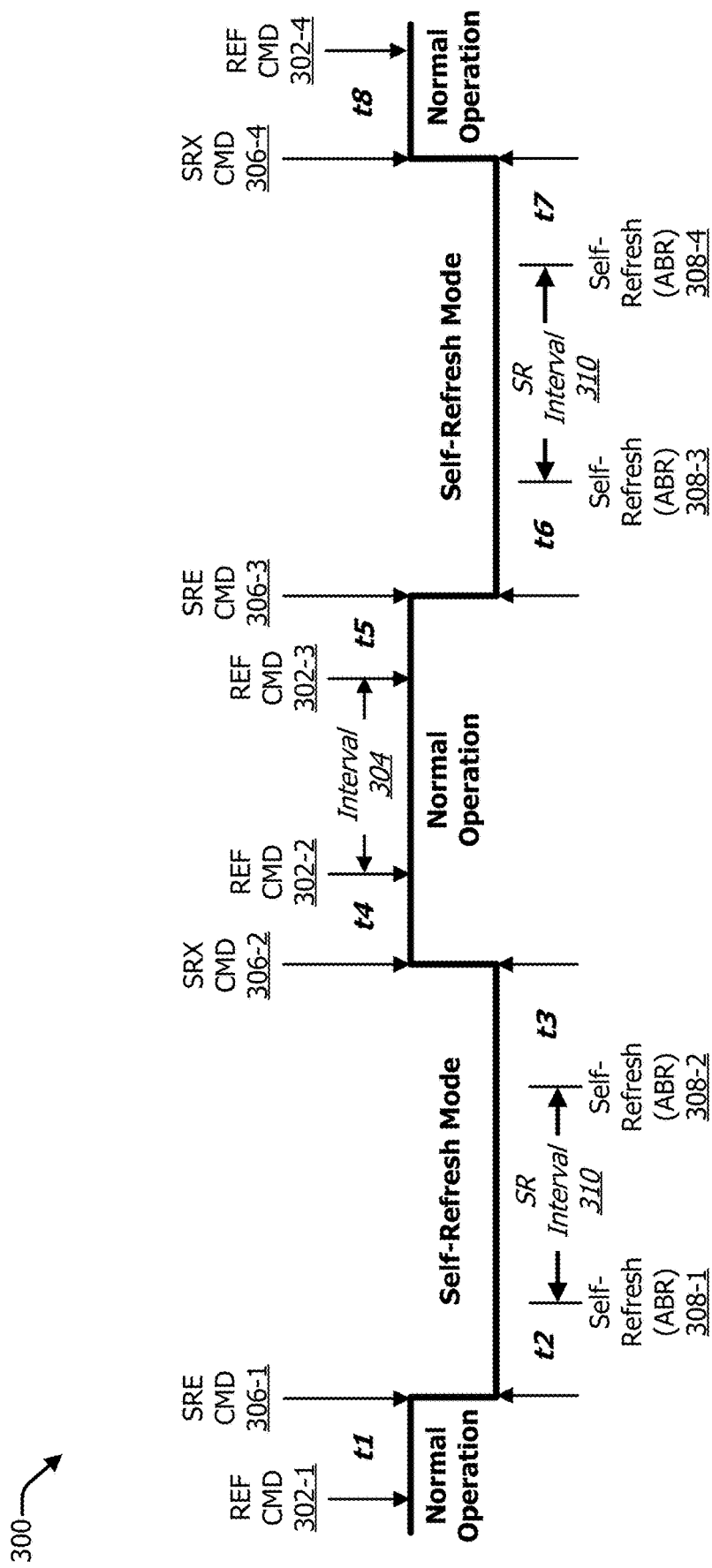
Figures 2, 3:
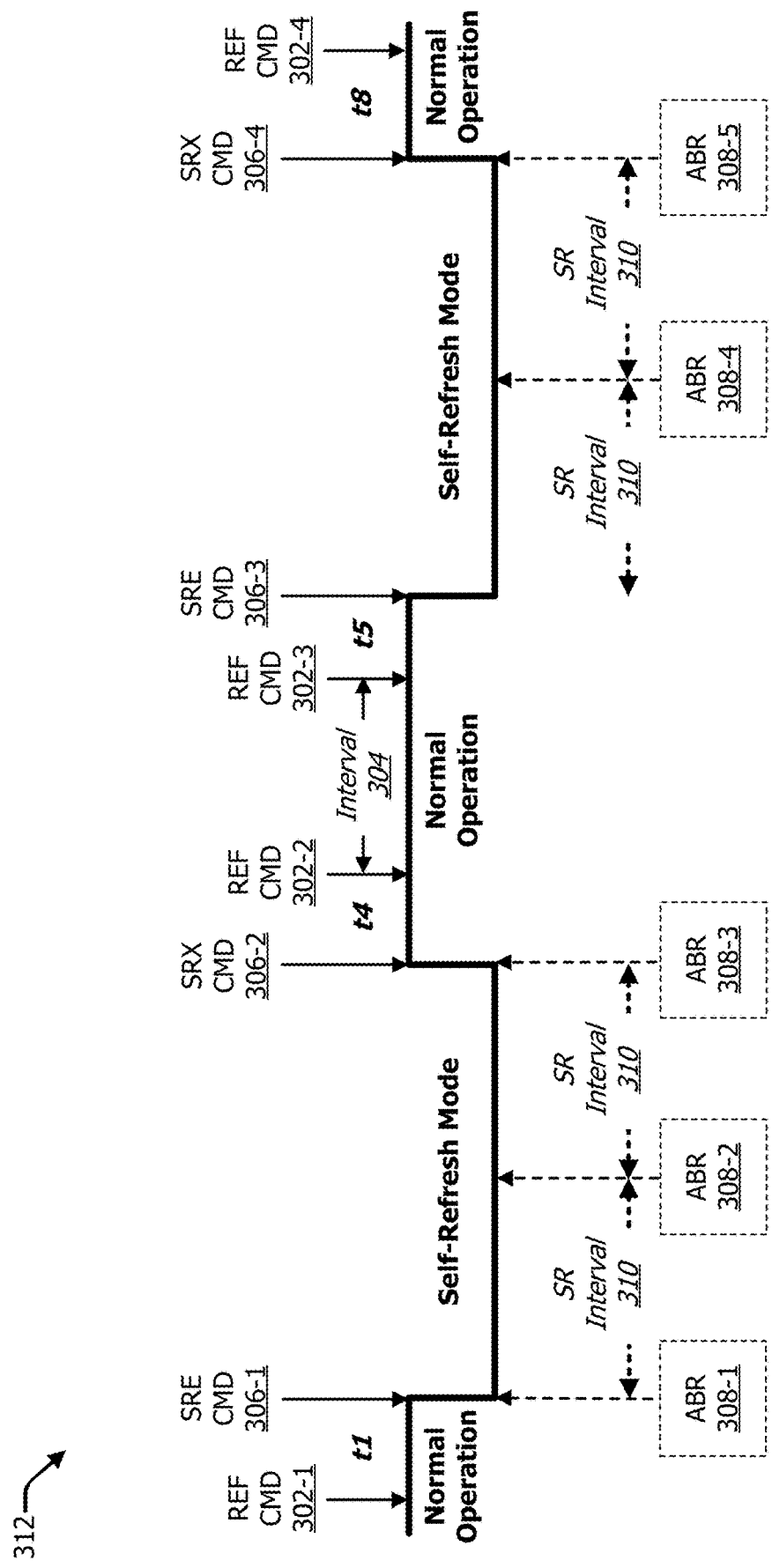

FIG. 3-1 illustrates an example operating diagram 300 that depicts aspects of how adaptive memory refresh control can be implemented with a memory device and/or a host device. The details of the example operating diagram 300 are described with reference to the host device 102 and the memory device 104, but such details are applicable to other apparatuses, DRAM memory systems, and devices, including the memory device 202 and the one or more processors 206. The example operating diagram 300 begins with the memory device 104 in normal operation (e.g., in a normal workflow or operation mode). In normal operation, the memory controller 108 may issue refresh commands 302 (e.g., an auto-refresh command) to the memory device 104 at intervals 304 based on a timer (e.g., a refresh timer controlled by the host device 102). For example, the interval 304 may be an effective refresh interval, tREFIe (e.g., between approximately 3.9 microseconds (μs) and approximately 16 μs, as described above). The host device 102 can also issue self-refresh commands 306 to the memory device 104, such as a self-refresh entry command (SRE CMD) or a self-refresh exit command (SRX CMD). The self-refresh commands 306 may be issued based on various factors, such as workload (e.g., a number and rate of read and/or write requests) or environment (e.g., operating temperature). When in the self-refresh mode, the memory device 104 may initiate, perform, or undergo self-refresh operations based on an internal timer (e.g., a self-refresh timer that is internal to the memory device 104).

Continuing the illustrated example, the host device 102 issues a refresh command (REF CMD) 302-1 to the memory device 104, and the refresh timer of the host device 102 begins counting toward the next refresh command 302. Before the end of the interval 304 (not shown), the host device 102 issues a self-refresh entry command (SRE CMD) 306-1. The SRE CMD 306-1 is associated with (e.g., may include) host-device refresh-timing information, which can indicate how much time t1 has elapsed since the host device 102 issued the REF CMD 302-1 or how much time t2 remains before the host device 102 is scheduled to issue a next refresh command 302. The memory device 104 can include circuitry (e.g., the control circuitry 118) that can access, receive, read, or interpret host-device refresh-timing information. The host-device refresh-timing information may be included with the SRE command by using one or more bits on a command bus that is part of an interconnect between the host device 102 and the memory device 104. Alternatively, the host-device refresh-timing information may be provided separately, such as by being associated with another command transmitted via a command bus of an interconnect (e.g., the interconnect 106), or as part of a write operation to a register associated with the memory device 104 (or 202) via a data bus of an interconnect (e.g., the interconnect 106). Before continuing with the example operating diagram 300, the tables of FIG. 4 are described.

FIG. 4 illustrates at 400 generally an example command truth table 400-1 and an example look-up table 400-2 that depict one way the CA bus 114 may be used to transmit host-device refresh-timing information in association with a command instructing or directing the memory device 104 (or 202) to enter a self-refresh mode or begin a self-refresh operation (e.g., the SRE command). In the example of FIG. 4, the host-device refresh-timing information indicates how much time remains of an interval 304 that is interrupted by a self-refresh entry command (e.g., SRE CMD 306-1). The command truth table 400-1 shows that pins CA3, CA4, and CA5, for instance, can be designated to provide the host-device refresh-timing information by setting a value (e.g., Low (L) or High (H)) for each pin, CA3-CA5, which correspond respectively to operands OP0, OP1, and OP2. The look-up table 400-2 provides example values of operands OP0, OP1, and OP2 that can be used to define or indicate the host-device refresh-timing information (e.g., a time remaining from the interval 304). For example, when the values of OP0-OP2 are all set to L, the remaining time is zero. When the values of OP0-OP2 are all set to H, the remaining time is 14 microseconds (μs).

In FIG. 4, the illustrated selection and number of designated pins in the command truth table 400-1, as well as the remaining time values (e.g., 0-14 μs) in the look-up table 400-2, provide merely one example for using the CA bus 114 to transmit the host-device refresh-timing information. This example provides one instance of how LPDDR5 can be extended to incorporate adaptive memory refresh control using the SRE command thereof. Future LPDDR specifications (e.g., LPDDR6), however, may incorporate, in a different manner, the principles of adaptive memory refresh control as described herein, such as with new commands or different pin assignments, including location and quantity of pins. Depending on various factors, such as the configuration of the memory device and the CA bus, other numbers and combinations of pins and operands may be used to provide the host-device refresh-timing information in other environments with a refresh-related command or using a different communication mechanism.

Returning now to the example illustrated in FIG. 3-1, the memory device 104 enters the self-refresh mode in response to receiving the SRE CMD 306-1. Because the memory device 104 also received the host-device refresh-timing information, which indicates the amount of remaining (e.g., leftover) time in the interval 304, the memory device 104 does not initiate or perform an all-bank self-refresh (ABR) 308 immediately upon entering the self-refresh mode. Instead, the memory device 104 can wait until the remaining time t2 has expired to initiate or perform the ABR 308-1 because the time periods t1 and t2 together are approximately equal to the interval 304.

Responsive to performing the ABR 308-1, the self-refresh timer at the memory device 104 begins counting time for a self-refresh interval (SR interval) 310 until the next ABR 308. The SR interval 310 may be an interval of similar length to the interval 304 (e.g., between approximately 3.9 microseconds (µs) and approximately 16 µs, as described above) or another interval. At or near the end of the SR interval 310, the memory device 104 performs another ABR 308-2. Responsive to performing the ABR 308-2, the self-refresh timer again begins timing the SR interval 310 (e.g., a next SR interval 310) until the next ABR 308.

Before the end of the next SR interval 310 (not explicitly shown), the host device 102 issues a self-refresh exit command (SRX CMD) 306-2. In response to the SRX CMD 306-2, the memory device 104 exits the self-refresh mode and may provide memory-device refresh-timing information to the host device 102. The memory-device refresh-timing information can indicate how much time t3 elapsed since the ABR 308-2 and before the host device 102 issued the SRX CMD 306-2 or how much time t4 remains in the next SR interval 310 that was "interrupted" by the SRX CMD 306-2 (e.g., t3+t4=SR interval 310). The memory-device refresh-timing information may be transmitted to the host device 102 using, for example, the DQ bus 116 (e.g., using one or more output DQ pins of the DQ bus 116). Alternatively, the memory device 104 may, for instance, communicate the memory-device refresh-timing information using a bidirectional command, control, or address bus.

In some implementations, the memory device 104 outputs the memory-device refresh-timing information to the host device 102 within a predefined time period (e.g., within approximately 250 nanoseconds, within approximately 210 nanoseconds, or within approximately 180 nanoseconds) after receiving the SRX CMD 306-2. In implementations in which the memory-device refresh-timing information is transmitted via the DQ bus 116, the host device 102 enables an input buffer (e.g., the host DQ input buffer) during the predefined time period so that the memory-device refresh-timing information can be latched stored for use by the host device 102. The memory device 104 can transmit the memory-device refresh-timing information to the host device 102 in response to the SRX CMD 306-2, in response to a separate read command (e.g., of a register holding the memory-device refresh-timing information), and so forth.

In this example, because the host device 102 receives the memory-device refresh-timing information, which can indicate the amount of remaining (e.g., leftover) time in the SR interval 310, the host device 102 does not issue another refresh command 302 immediately upon ending the self-refresh mode. Instead, the host device 102 can wait until the remaining time t4 has expired to perform the REF CMD 302-2. Responsive to issuing the REF CMD 302-2, the refresh timer at the host device 102 begins counting another interval 304. At or near the end of the interval 304, the host device 102 issues another REF CMD 302-3, and the refresh timer of the host device 102 begins counting toward the next refresh command 302. Before the end of the next interval 304 (not explicitly shown), the host device 102 issues a self-refresh entry command (SRE CMD) 306-3 instead of another refresh command 302. The SRE CMD 306-3 includes or is otherwise associated with host-device refresh-timing information, which can indicate how much time t5 has elapsed since the host device 102 issued a most-recent refresh command (e.g., the REF CMD 302-3) or how much time t6 remains before the host device 102 is scheduled to issue a next refresh command 302 (not shown).

The memory device 104 enters the self-refresh mode in response to receiving the SRE CMD 306-3. Because the memory device 104 has again received the host-device refresh-timing information, the memory device 104 can wait until the remaining time t6 has expired to initiate or perform another ABR 308-3. Here, the time periods t5 and t6 together are approximately equal to the interval 304. Responsive to performing the ABR 308-3, the self-refresh timer at the memory device 104 begins counting time for another SR interval 310 until the next ABR 308. At or near the end of the SR interval 310, the memory device 104 performs another ABR 308-4, and responsive to performing the ABR 308-4, the self-refresh timer begins timing another SR interval 310 (not explicitly shown).

Before the end of this other SR interval 310, the host device 102 issues a self-refresh exit command (SRX CMD) 306-4. In response to the SRX CMD 306-4, the memory device 104 exits the self-refresh mode and may provide memory-device refresh-timing information to the host device 102. The memory-device refresh-timing information can indicate how much time t7 elapsed before the host device 102 issued the SRX CMD 306-4 or how much time t8 remains in the current SR interval 310 that was interrupted by the SRX CMD 306-4 (e.g., t7+t8=SR interval 310). Because the host device 102 received the memory-device refresh-timing information, the host device 102 does not issue another refresh command 302 immediately upon the memory device exiting the self-refresh mode. Instead, the host device 102 can wait until the remaining time t8 has expired to perform the REF CMD 302-4. Responsive to performing the REF CMD 302-4, the refresh timer at the host device 102 begins counting another interval 304, and the process can continue in this manner with the host device 102 and the memory device 104 sharing refresh-timing information.

The example operating diagram 300 illustrated in FIG. 3-1 depicts aspects of how adaptive memory refresh control can be implemented in a memory device and a host device. In contrast, FIG. 3-2 illustrates aspects of how a memory device that does not implement adaptive memory refresh control (e.g., but that may otherwise be similar to the memory device 104) operates relative to the operation of the memory device of FIG. 3-1. In FIG. 3-2, the advantages of adaptive memory refresh control can be seen via an example comparison diagram 312. In the example comparison diagram 312, some elements of the example operating diagram 300 may be omitted or altered for clarity.

In the example depicted in the comparison diagram 312, when another host device issues an SRE CMD 306-1, the other memory device does not receive host-device refresh-timing information. Consequently, as shown, the other memory device may perform the ABR 308-1 immediately upon entering the self-refresh mode. As the refresh commands 302 and the self-refresh commands 306 are issued, the other host device and the other memory device restart respective refresh and self-refresh timers. This is in contrast with waiting for any leftover time to expire from the previous timer of the other device like in FIG. 3-1. Thus, as shown in the example comparison diagram 312, the other memory device performs an "extra" all-bank refresh (ABR 308-5) that was avoided when using adaptive memory refresh control in the same timespan as shown in FIG. 3-1.

The example comparison diagram 312 illustrates one advantage of using the described adaptive memory refresh control techniques and apparatuses, which is reducing the number of refresh operations performed. Reducing the number of refresh operations that are performed can not only reduce power consumption, but it may also lead to improved system performance (e.g., by reducing latency and increasing data rate) while maintaining memory reliability through timely refresh operations that support accurate data retention in a DRAM. This document now turns toward example methods for implementing adaptive memory refresh control.

Example Methods

Figure 5:
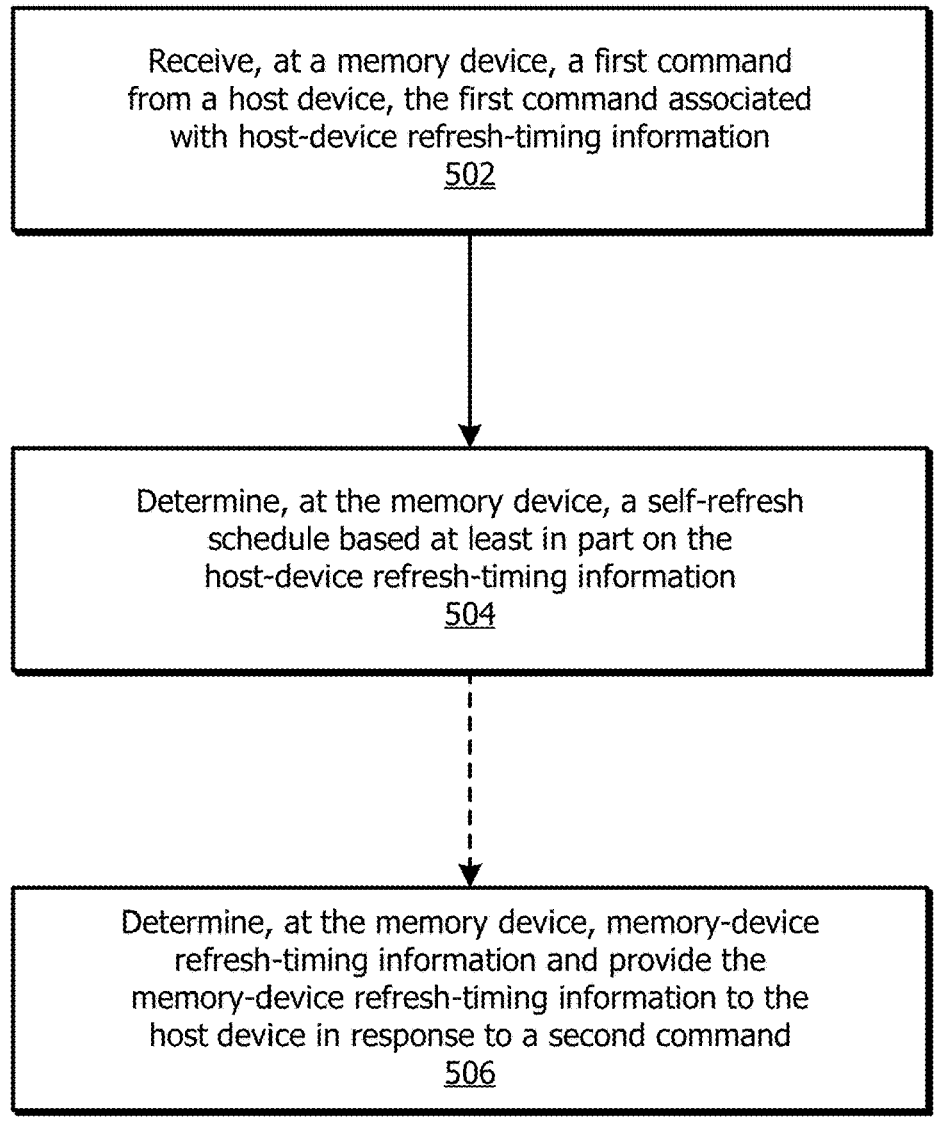
FIGS. 5 through 7 illustrate example methods for an apparatus to implement aspects of adaptive memory refresh control.
Figure 6:
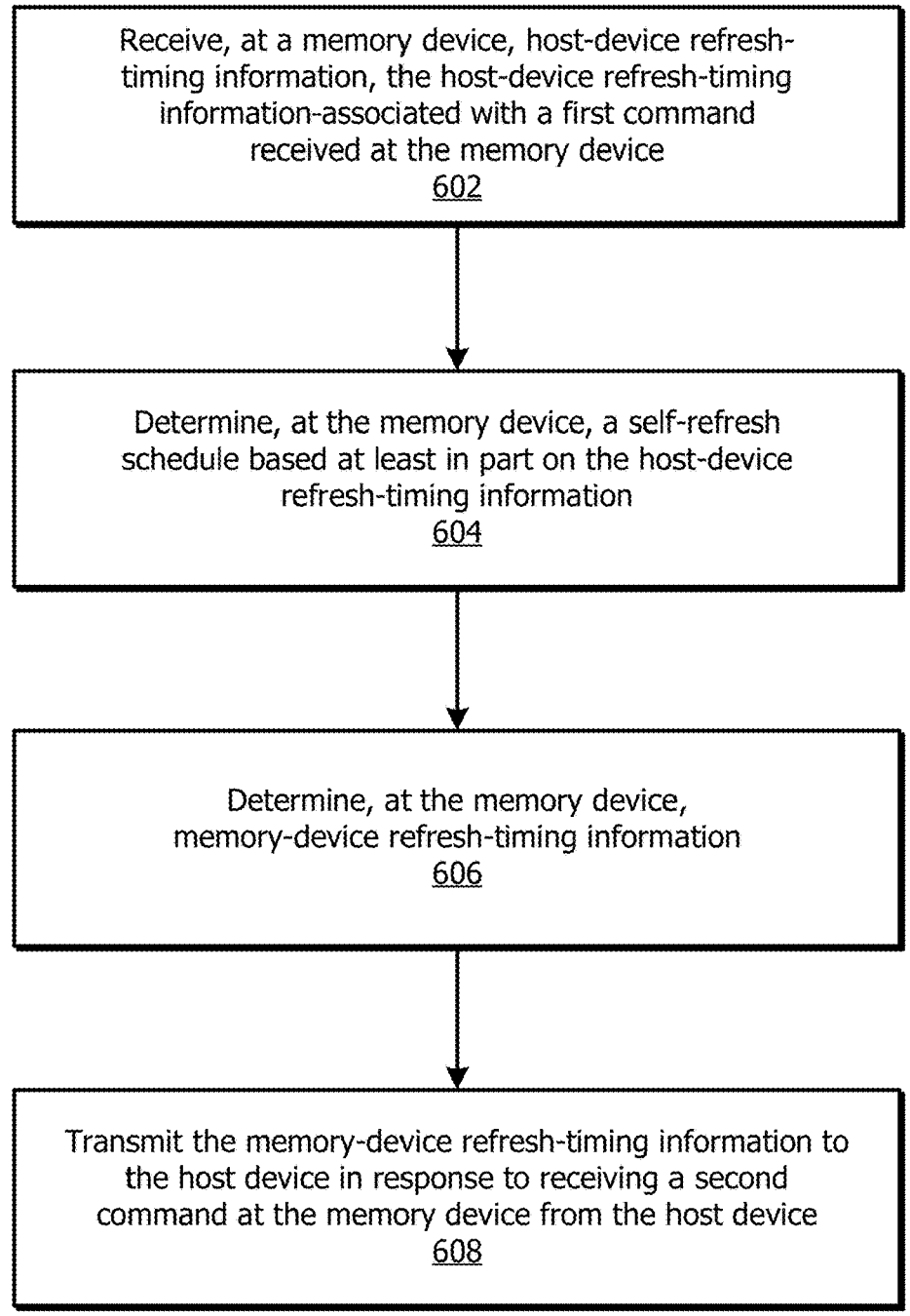
Figure 7:
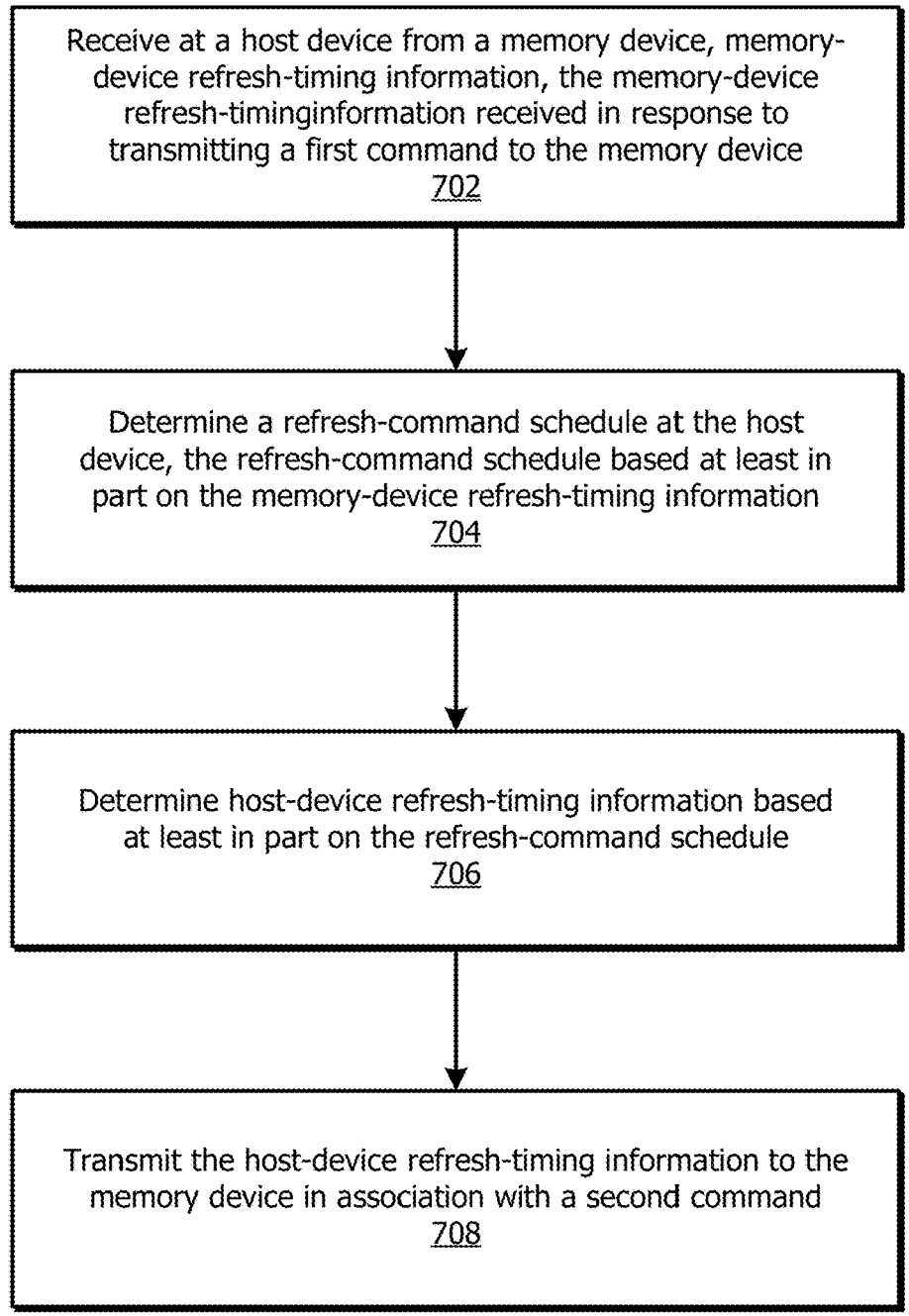

FIG. 5 through FIG. 7 illustrate example methods 500-700 for an apparatus or system to implement adaptive memory refresh control. The following discussion may reference components or techniques described with reference to the example apparatus 100, the example system 200, the example operating diagram 300 of FIG. 3-1, or tables 400-1 and 400-2 described with reference to FIG. 4, but such references are made only by way of example.

At 502, a memory device receives from a host device a command that is associated with host-device refresh-timing information. For example, the memory device can receive a self-refresh entry command (e.g., the self-refresh entry command 306 as described with reference to FIG. 3-1) that includes or is otherwise associated with the host-device refresh-timing information. The memory device may be the memory device 104 as described with reference to FIG. 1 or the memory device 202 of FIG. 2, and the host device may be the host device 102 or the processors 206, as described with reference to FIGS. 1 and 2, respectively. Further, the memory device and/or the host device may be enabled to implement one or more features described with reference to FIGS. 3-1 and FIG. 4.

In some implementations, the host-device refresh-timing information can indicate an amount of time that has elapsed since the host device issued a command directing the memory device to initiate or undergo a most-recent or ongoing refresh operation (e.g., since a previous or current auto-refresh command was issued). Alternatively or additionally, the host-device refresh-timing information can indicate an amount of time that remains before the host device is scheduled to issue a command directing the memory device to initiate or undergo a next refresh operation. For example, the host-device refresh-timing information can indicate either or both of the time periods t1 or t2 (or other corresponding time periods) described above with reference to FIG. 3-1.

At 504, the memory device determines a self-refresh schedule based at least in part on the host-device refresh-timing information. For example, the memory device 104 can determine an all-bank self-refresh schedule based at least in part on the host-device refresh-timing information. Because the memory device receives the host-device refresh-timing information, which can indicate the amount of remaining (e.g., leftover) time before the host device is scheduled to issue a refresh or auto-refresh command, the memory device can wait until the remaining time (e.g., the time t2) has expired to initiate, perform, or undergo a self-refresh operation.

At 506, in some implementations, the memory device can determine or otherwise obtain the memory-device refresh-timing information and provide the memory-device refresh-timing information to another device (e.g., to the host device 102 or the processors 206). The memory device may determine and/or provide the memory-device refresh-timing information in response to receiving another command (e.g., a command to exit a self-refresh mode, such as the SRX command).

The memory-device refresh-timing information can indicate an amount of time that has elapsed since the memory device performed (e.g., initiated, began to undergo, or completed) a current self-refresh operation and/or an amount of time that remains before the memory device is scheduled to initiate or undergo a next self-refresh operation. For example, the memory-device refresh-timing information can indicate either or both of the time periods t3 or t4 (or other corresponding time periods) described with reference to FIG. 3-1. Thus, because the host device 102 receives memory-device refresh-timing information, which can indicate the amount of remaining (e.g., leftover) time in a current self-refresh interval, the host device 102 can wait until the remaining time (e.g., the time t4) has expired to issue a next refresh or auto-refresh command.

Turning now to the method 600, at 602, a memory device receives host-device refresh-timing information from a host device, the host-device refresh-timing information included or otherwise associated with a first command received at the memory device. For example, the memory device may be the memory device 104 as described with reference to FIG. 1, and the host device may be the host device 102 or the processors 206, as described with reference to FIGS. 1 and 2, respectively. Further, the memory device and/or the host device may be enabled to implement one or more features described with reference to FIGS. 3-1 and FIG. 4. The host-device refresh-timing information here may correspond to the host-device refresh-timing information as described with reference to any of the preceding figures.

At 604, the memory device determines a self-refresh schedule based at least in part on the host-device refresh-timing information. For example, the memory device 104 can determine a self-refresh schedule based at least in part on the host-device refresh-timing information. Because the memory device receives the host-device refresh-timing information, which can indicate the amount of remaining (e.g., leftover) time before the host is scheduled to issue another refresh or auto-refresh command, the memory device can wait until the remaining time (e.g., the time t2 described with reference to FIG. 3-1) has expired to initiate, perform, or undergo a self-refresh operation. In some implementations, the self-refresh schedule is provided to the memory device after being determined at another device, based at least in part on the host-device refresh-timing information.

At 606, the memory device determines memory-device refresh-timing information. For example, the memory device 104 can determine the memory-device refresh-timing information in response to receiving a command to exit a self-refresh mode, such as the SRX command. The memory-device refresh-timing information here may correspond to the memory-device refresh-timing information as described with reference to any of the preceding figures. In some implementations, the memory device 104 determines the memory-device refresh-timing information on an ongoing basis during the self-refresh mode, rather than in response to the command.

At 608, the memory device transmits the memory-device refresh-timing information to the host device in response to receiving a second command at the memory device. For example, the memory device 104 can transmit the memory-device refresh-timing information to the host device 102 in response to a command directing the memory device 104 to exit the self-refresh mode, such as the SRX command. In some implementations, the memory device 104 determines the memory-device refresh-timing information on an ongoing basis during the self-refresh mode. In other implementations the memory-device refresh-timing information may be determined in response to the command.

Turning now to the method 700, at 702, a host device receives memory-device refresh-timing information from a memory device in response to transmitting a command to the memory device. For example, the host device may be the host device 102 or the processors 206, as described with reference to FIG. 1 and FIG. 2, respectively, and the memory device may be the memory device 104 or 202 as described with reference to FIG. 1 and FIG. 2, respectively. Further, the memory device and/or the host device may be enabled to implement one or more features described with reference to FIGS. 3-1 and FIG. 4. The memory-device refresh-timing information here may correspond to the memory-device refresh-timing information as described with reference to any of the preceding figures. The host device may thus receive the memory-device refresh-timing information from the memory device in response to transmitting a command directing the memory device to exit a self-refresh mode (e.g., the SRX command).

At 704, the host device determines a refresh-command schedule based at least in part on the memory-device refresh-timing information. For example, the host device 102 can determine a refresh-command schedule based at least in part on the memory-device refresh-timing information. Because the host device 102 receives the memory-device refresh-timing information, which can indicate the amount of remaining (e.g., leftover) time in a current self-refresh interval at the memory device, the host device 102 can wait until the time remaining in the current self-refresh interval (e.g., the time t4 as described with reference to FIG. 3-1) has expired to issue a next refresh or auto-refresh command.

At 706, the host device determines host-device refresh-timing information based at least in part on the refresh-command schedule. For example, the host device 102 can determine the host-device refresh-timing information based at least in part on the refresh-command schedule.

At 708, the host device transmits the host-device refresh-timing information to the memory device in association with another command. For example, the host device 102 can transmit the host-device refresh-timing information to the memory device 104 in association with a command to enter a self-refresh mode (e.g., the SRE command).

Aspects of these methods may be implemented in, for example, hardware (e.g., fixed-logic circuitry or a processor in conjunction with a memory), firmware, or some combination thereof. The methods may be realized using one or more of the apparatuses, components, or schemes shown in FIGS. 1 to 3-1 and FIG. 4, the components of which may be further divided, combined, rearranged, and so on. The devices and components of these figures generally represent hardware, such as electronic devices, packaged modules, IC chips, or circuits; firmware or the actions thereof software; or a combination thereof. With reference to FIGS. 1 to 1-3 and FIG. 4, in some cases, a host device 102 or a memory device 104 may individually perform the operations of these methods. In other cases, a host device 102 and a memory device 104 may jointly perform the operations. Thus, these figures illustrate some of the many possible systems or apparatuses capable of implementing the described methods.

Several example implementations are described below.

Example 1: A method, comprising: receiving a first command at a memory device from a host device, the first command associated with host-device refresh-timing information; and determining at the memory device a self-refresh schedule based at least in part on the host-device refresh-timing information.

Example 2: The method of example 1, wherein the host-device refresh-timing information indicates at least one of: a first amount of time that has elapsed since the host device issued a second command to direct the memory device to undergo a refresh operation; or a second amount of time that remains before the host device is scheduled to issue a third command to direct the memory device to perform a next refresh operation.

Example 3: The method of example 1 or example 2, further comprising: initiating a self-refresh operation at the memory device after the second amount of time elapses responsive to receiving the first command.

Example 4: The method of any preceding example, further comprising: determining, at the memory device, memory-device refresh-timing information based at least in part on the self-refresh schedule.

Example 5: The method of any preceding example, further comprising: transmitting the memory-device refresh-timing information to the host device in response to a second command.

Example 6: The method of any preceding example, wherein the memory-device refresh-timing information indicates at least one of: a first amount of time that has elapsed since the memory device initiated a self-refresh operation; or a second amount of time that remains before the memory device is scheduled to undergo a next self-refresh operation.

Example 7: The method of any preceding example, further comprising: receiving a third command at the memory device that directs the memory device to undergo a refresh operation after the second amount of time elapses.

Example 8: A memory device comprising: at least one memory array; and
control circuitry configured to: access host-device refresh-timing information, the host-device refresh-timing information received in association with a first command from a host device; and determine a self-refresh schedule for a memory cell of the at least one memory array based at least in part on the host-device refresh-timing information.

Example 9: The memory device of example 8, wherein: the memory device is configured to receive the host-device refresh-timing information via an interconnect using one or more bits of the first command.

Example 10: The memory device of example 8 or example 9, wherein: the memory device is configured to receive, via a data bus of an interconnect, the host-device refresh-timing information as part of a write operation to a register of the memory device.

Example 11: The memory device of any of examples 8-10, wherein the host-device refresh-timing information indicates at least one of: a first amount of time that has elapsed since the host device issued a second command to direct the memory device to undergo a refresh operation; or a second amount of time that remains before the host device is scheduled to issue a third command to direct the memory device to perform a next refresh operation.

Example 12: The memory device of any of examples 8-11, wherein the first command comprises a command that directs the memory device to enter a self-refresh mode.

Example 13: The memory device of any of examples 8-12, wherein the memory device is configured to enter the self-refresh mode in response to receiving the first command and to initiate a first self-refresh operation in the self-refresh mode after the second amount of time has elapsed.

Example 14: The memory device of any of examples 8-13, wherein the control circuitry is configured to: determine memory-device refresh-timing information based at least in part on the self-refresh schedule; and transmit the memory-device refresh-timing information to the host device in response to a second command.

Example 15: The memory device of any of examples 8-14, wherein the memory device is configured to transmit the memory-device refresh-timing information to the host device via a data bus coupling the memory device to the host device.

Example 16: The memory device of any of examples 8-15, wherein: the memory device is configured to transmit the memory-device refresh-timing information to the host device within a predefined time period of receiving the second command.

Example 17: The memory device of any of examples 8-16, wherein the predefined time period comprises: approximately 250 nanoseconds (ns), approximately 210 ns, or approximately 180 ns.

Example 18: The memory device of any of examples 8-17, wherein the memory-device refresh-timing information indicates at least one of: a first amount of time that has elapsed since the memory device performed a self-refresh operation; or a second amount of time that remains before the memory device is scheduled to undergo a next self-refresh operation.

Example 19: A host device comprising: an interface; and control circuitry coupled to the interface, the control circuitry configured to: receive memory-device refresh-timing information from a memory device in response to the host device issuing a first command to the memory device; and determine a refresh-command schedule for the memory device based at least in part on the memory-device refresh-timing information.

Example 20: The host device of example 19, wherein: the interface comprises an input buffer; and the host device is configured to enable the input buffer to store the memory-device refresh-timing information for access by the control circuitry.

Example 21: The host device of example 19 or example 20, wherein the input buffer comprises a data input buffer.

Example 22: The host device of any of examples 19-21, wherein the memory-device refresh-timing information indicates at least one of: a first amount of time that has elapsed since the memory device performed a self-refresh operation; or a second amount of time that remains before the memory device is scheduled to undergo a next self-refresh operation.

Example 23: The host device of any of examples 19-22, wherein the control circuitry is further configured to issue a second command that directs the memory device to undergo a refresh operation, the second command issued after the second amount of time elapses responsive to receiving the memory-device refresh-timing information.

Example 24: The host device of any of examples 19-23, wherein the control circuitry is further configured to: determine host-device refresh-timing information based at least in part on the refresh-command schedule; and transmit the host-device refresh-timing information to the memory device in association with a second command.

Example 25: The host device of any of examples 19-24, wherein the second command comprises a command that directs the memory device to enter a self-refresh mode.

Example 26: The host device of any of examples 19-25, wherein the second command comprises the host-device refresh-timing information.

Example 27: The host device of any of examples 19-26, wherein the host-device refresh-timing information indicates at least one of: a first amount of time that has elapsed since the host device issued a second command to direct the memory device to perform a refresh operation; or a second amount of time that remains before the host device is scheduled to issue a third command to direct the memory device to perform a next refresh operation.

Example 28: A method, comprising: receiving host-device refresh-timing information at a memory device from a host device, the host-device refresh-timing information associated with a first command received at the memory device; determining a self-refresh schedule at the memory device based at least in part on the host-device refresh-timing information; determining memory-device refresh-timing information; and transmitting the memory-device refresh-timing information to the host device in response to receiving a second command at the memory device from the host device.

Example 29: A method, comprising: receiving memory-device refresh-timing information at a host device from a memory device, the memory-device refresh-timing information received in response to transmitting a first command to the memory device; determining a refresh-command schedule at the host device based at least in part on the memory-device refresh-timing information; determining host-device refresh-timing information based at least in part on the refresh-command schedule; and transmitting the host-device refresh-timing information to the memory device in association with a second command.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" or "one or more of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for adaptive memory refresh control have been described in language specific to certain features and/or methods, the subject of the appended claims is not necessarily limited to the specific features or methods described. Rather, the specific features and methods are disclosed as example implementations for adaptive memory refresh control.

What is claimed is:

1. A method, comprising:
receiving a first command at a memory device from a host device, the first command associated with host-device refresh-timing information, the host-device refresh-timing information indicating at least a first amount of time that remains before the host device is scheduled to issue a second command to direct the memory device to perform a next refresh operation;
determining at the memory device a self-refresh schedule based at least in part on the host-device refresh-timing information;
determining, at the memory device, memory-device refresh-timing information based at least in part on the self-refresh schedule, the memory-device refresh-timing information indicating at least a second amount of time that remains before the memory device is scheduled to undergo a next self-refresh operation; and
transmitting the memory-device refresh-timing information to the host device in response to a third command.

2. The method of claim 1, wherein the host-device refresh-timing information further indicates:
a third amount of time that has elapsed since the host device issued a fourth command to direct the memory device to undergo a refresh operation, the fourth command prior to the first command.

3. The method of claim 1, further comprising:
initiating a self-refresh operation at the memory device after the first amount of time elapses responsive to receiving the first command.

4. The method of claim 1, wherein the memory-device refresh-timing information further indicates
a third amount of time that has elapsed since the memory device initiated a self-refresh operation.

5. The method of claim 1, further comprising:
receiving a fourth command at the memory device that directs the memory device to undergo a refresh operation after the second amount of time elapses.

6. A memory device comprising:
at least one memory array; and
control circuitry configured to:
access host-device refresh-timing information, the host-device refresh-timing information:
received in association with a first command from a host device; and
indicating at least a first amount of time that remains before the host device is scheduled to issue a second command to direct the memory device to perform a next refresh operation;
determine a self-refresh schedule for a memory cell of the at least one memory array based at least in part on the host-device refresh-timing information;
determine memory-device refresh-timing information based at least in part on the self-refresh schedule, the memory-device refresh-timing information indicating at least a second amount of time that remains before the memory device is scheduled to undergo a next self-refresh operation; and
transmit the memory-device refresh-timing information to the host device in response to a third command.

7. The memory device of claim 6, wherein:
the memory device is configured to receive the host-device refresh-timing information via an interconnect using one or more bits of the first command.

8. The memory device of claim 6, wherein:
the memory device is configured to receive, via a data bus of an interconnect, the host-device refresh-timing information as part of a write operation to a register of the memory device.

9. The memory device of claim 6, wherein the host-device refresh-timing information further indicates a third amount of time that has elapsed since the host device issued a fourth command to direct the memory device to undergo a refresh operation, the fourth command prior to the first command.

10. The memory device of claim 6, wherein the first command comprises a command that directs the memory device to enter a self-refresh mode.

11. The memory device of claim 10, wherein the memory device is configured to enter the self-refresh mode in response to receiving the first command and to initiate a first self-refresh operation in the self-refresh mode after the second amount of time has elapsed.

12. The memory device of claim 6, wherein the memory device is configured to transmit the memory-device refresh-timing information to the host device via a data bus coupling the memory device to the host device.

13. The memory device of claim 6, wherein:
the memory device is configured to transmit the memory-device refresh-timing information to the host device within a predefined time period of receiving the third command.

14. The memory device of claim 13, wherein the predefined time period comprises:
approximately 250 nanoseconds (ns), approximately 210 ns, or approximately 180 ns.

15. The memory device of claim 6, wherein the memory-device refresh-timing information further indicates
a third amount of time that has elapsed since the memory device performed a self-refresh operation.

16. A host device comprising:
an interface; and
control circuitry coupled to the interface, the control circuitry configured to:
receive memory-device refresh-timing information from a memory device in response to the host device issuing a first command to the memory device, the memory-device refresh-timing information indicating at least a first amount of time that remains before the memory device is scheduled to undergo a next self-refresh operation;
determine a refresh-command schedule for the memory device based at least in part on the memory-device refresh-timing information;
determine host-device refresh-timing information based at least in part on the refresh-command schedule, the host-device refresh-timing information indicating at least a second amount of time that remains before the host device is scheduled to issue a second command to direct the memory device to perform a refresh operation; and
transmit the host-device refresh-timing information to the memory device in association with the second command.

17. The host device of claim 16, wherein:
the interface comprises an input buffer; and
the host device is configured to enable the input buffer to store the memory-device refresh-timing information for access by the control circuitry.

18. The host device of claim 17, wherein the input buffer comprises a data input buffer.

19. The host device of claim 16, wherein the memory-device refresh-timing information further indicates a third amount of time that has elapsed since the memory device performed a self-refresh operation.

20. The host device of claim 19, wherein the control circuitry is further configured to issue the second command that directs the memory device to the refresh operation, the second command issued after the first amount of time elapses and responsive to receiving the memory-device refresh-timing information.

21. The host device of claim 16, wherein the second command comprises a command that directs the memory device to enter a self-refresh mode.

22. The host device of claim 16, wherein the second command includes the host-device refresh-timing information.

23. The host device of claim 16, wherein the host-device refresh-timing information further indicates a third amount of time that has elapsed since the host device issued a third command to direct the memory device to perform another refresh operation, the third command prior to the second command.

24. A method, comprising:
receiving host-device refresh-timing information at a memory device from a host device, the host-device refresh-timing information associated with a first command received at the memory device;
determining a self-refresh schedule at the memory device based at least in part on the host-device refresh-timing information;
determining memory-device refresh-timing information, the memory-device refresh-timing information indicating at least a first amount of time that remains before the memory device is scheduled to undergo a next self-refresh operation; and
transmitting the memory-device refresh-timing information to the host device in response to receiving a second command at the memory device from the host device, and wherein:
the host-device refresh-timing information indicates at least a second amount of time that remains before the host device is scheduled to issue the second command to the memory device.

25. The method of claim 24, wherein the first command comprises a command that directs the memory device to enter a self-refresh mode.

26. A method, comprising:
receiving memory-device refresh-timing information at a host device from a memory device, the memory-device refresh-timing information:
received in response to transmitting a first command to the memory device; and
indicating at least a first amount of time that remains before the memory device is scheduled to undergo a next self-refresh operation;
determining a refresh-command schedule at the host device based at least in part on the memory-device refresh-timing information;
determining host-device refresh-timing information based at least in part on the refresh-command schedule; and
transmitting the host-device refresh-timing information to the memory device in association with a second command, and wherein:
the host-device refresh-timing information indicates at least a second amount of time that remains before the host device is scheduled to issue a third command to the memory device.

27. The method of claim 26, wherein the second command comprises a command that directs the memory device to enter a self-refresh mode.

* * * * *